(12) United States Patent
Amano

(10) Patent No.: US 9,443,914 B2
(45) Date of Patent: Sep. 13, 2016

(54) ARRAY SUBSTRATE AND MANUFACTURING METHOD THEREOF

(71) Applicant: Japan Display Inc., Minato-ku (JP)

(72) Inventor: Yuichi Amano, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 14/612,979

(22) Filed: Feb. 3, 2015

(65) Prior Publication Data

US 2015/0221705 A1    Aug. 6, 2015

(30) Foreign Application Priority Data

Feb. 6, 2014    (JP) .................... 2014-021559

(51) Int. Cl.
*H01L 27/32*    (2006.01)
*H01L 27/12*    (2006.01)
*H01L 29/786*   (2006.01)
*H01L 29/66*    (2006.01)

(52) U.S. Cl.
CPC ......... *H01L 27/3223* (2013.01); *H01L 27/124* (2013.01); *H01L 27/127* (2013.01); *H01L 27/1233* (2013.01); *H01L 27/3276* (2013.01); *H01L 29/6675* (2013.01); *H01L 29/78672* (2013.01); *H01L 27/3248* (2013.01); *H01L 27/3258* (2013.01)

(58) Field of Classification Search
CPC ............. H01L 27/3276; H01L 27/124; H01L 27/3223; H01L 27/3244; H01L 27/3246
See application file for complete search history.

(56) References Cited

U.S. PATENT DOCUMENTS

| 2010/0097538 | A1 | 4/2010 | Ota |
| 2012/0169688 | A1* | 7/2012 | Chen ................. H04N 13/0404 345/209 |

FOREIGN PATENT DOCUMENTS

JP    11 52427    2/1999

* cited by examiner

*Primary Examiner* — Tony Tran
(74) *Attorney, Agent, or Firm* — Oblon, McClelland, Maier & Neustadt, L.L.P

(57) ABSTRACT

An array substrate for an FPD device, wherein, in each of the display pixel dots in the display area, the first connection wiring is connected to the pixel electrode via a contact hole while the second connection wiring is connected to the signal line via a contact hole; in each of the dummy pixel dots, the first connection wiring is not electrically connected to any of the pixel electrodes; in the peripheral non-viewing area extending in a direction along the signal line, the first connection wiring extends in a direction away from the scanning line at a position distanced from the switching element, and has a pad having a width larger than other part of the first connection wiring at its distal end.

1 Claim, 2 Drawing Sheets

ARRAY SUBSTRATE AND MANUFACTURING METHOD THEREOF

CROSS-REFERENCE TO RELATED APPLICATIONS

This application is based upon and claims the benefit of priority from the prior Japanese Patent Application No. 2014-21559, filed on Feb. 6, 2014; the entire contents of which are incorporated herein by reference.

FIELD

The embodiments of the present invention relate to an array substrate for a flat-panel display (FPD) device having dummy pixels on a peripheral area of the substrate, and a manufacturing method of such array substrate.

BACKGROUND

Such flat-panel display (FPD) device generally comprises the display panel and a driver device. Liquid-crystal display (LCD) devices are most typical among FPD devices and are widely used as display devices for PCs and TV sets, for vehicle-mounted display devices such as car navigators and for mobile devices such as smart phones and other mobile phones as well as information terminals or digital assists. A display panel of the LCD device comprises an array substrate and a counter substrate, which are adhered to each other through a sealing material, and a liquid crystal layer interposed between these substrates. The organic EL display device is typically obtained by: arranging an organic EL film on the array substrate, and covering and sealing with a resin or the like.

The array substrate comprises in general, on its viewing area or pixel-array area, an array of scanning lines and an array of signal lines that intersect the scanning lines as well as a switching element and a pixel electrode at each intersection of the signal and scanning lines. The array substrate typically has, on its peripheral non-viewing area (so called "frame area") at around the viewing area, connection terminals and optionally dummy pixels if needed. The dummy pixels are typically for preventing an occurrence of electrostatic destruction, especially due to a rubbing process, during manufacturing the array substrate.

Brought into a practical use in recent years are the FPD devices adopting a low-temperature polysilicon (LT-p-Si) film for forming the switching element of the array substrate. By such FPD device, higher definition is easily achieved, and a driver circuit or the like is able to be constructed on the array substrate. Moreover, a touch screen may be constructed in the interior of the display panel.

To cope with requirements of weight and size reduction of the FPD device, it is required to minimize the width of the peripheral non-display area and, in same time, to reliably prevent electrostatic destruction so as to keep high the manufacturing yield and reliability of the FPD device.

In view of the above, it is aimed in embodiments of the invention to improve a protection against electrostatic destruction while keeping small the width of an area for arranging dummy pixels, an array substrate and its manufacturing method for an FPD device, especially for that having the low-temperature polysilicon film.

DETAILED DESCRIPTION

Figure 1:
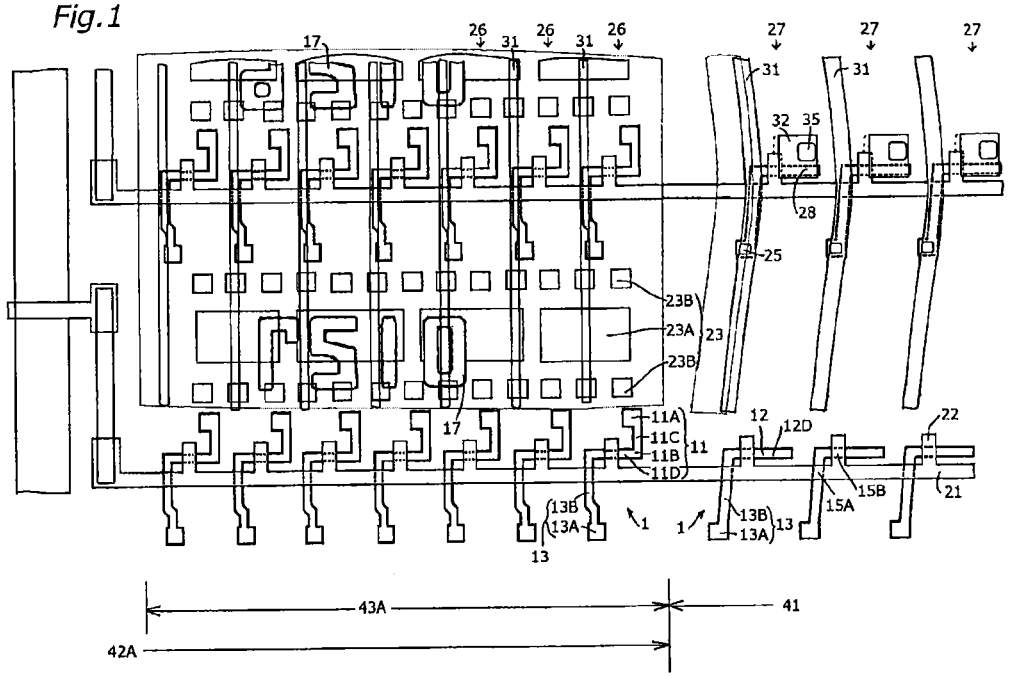
FIG. 1 is a plan view showing an essential portion of an array substrate according to an embodiment of the invention.

According to embodiments of the invention, an array substrate comprises: an array of scanning lines and an array of signal lines that intersect the scanning lines; a switching element and a pixel electrode, which are arranged for each intersection of the scanning and signal lines; a view area, in which display pixel dots are arrayed and which corresponds to an image display area of a flat-panel display (FPD) device; and a dummy pixel area, in which dummy pixel dots are arrayed and which is in a peripheral non-viewing area that surrounds the view area; wherein, in each of the display pixel dots and in each of the dummy pixel dots, a first connection wiring and a second connection wiring are arranged to extend respectively from one terminal and another terminal of the switching element; in each of the display pixel dots in the display area, the first connection wiring is connected to the pixel electrode via a contact hole while the second connection wiring is connected to the signal line via a contact hole; in each of the dummy pixel dots, the first connection wiring is not electrically connected to any of the pixel electrodes; in the peripheral non-viewing area extending in a direction along the signal line, the first connection wiring extends in a direction away from the scanning line at a position distanced from the switching element, and has a pad having a width larger than other part of the first connection wiring at its distal end.

According to embodiments of the invention, a method of manufacturing an array substrate that has: an array of scanning lines and an array of signal lines that intersect the scanning lines; a switching element and a pixel electrode, which are arranged for each intersection of the scanning and signal lines; a view area, in which display pixel dots are arrayed and which corresponds to an image display area of a flat-panel display (FPD) device; and a dummy pixel area, in which dummy pixel dots are arrayed and which is in a peripheral non-viewing area that surrounds the view area; comprising: forming a semiconductor film of the switching element as well as a first connection wiring and a second connection wiring, which are respectively extended from one terminal and another terminal of the switching element by forming a low-temperature polysilicon film or a film for the semiconductor film and said wiring patterns and by patterning and doping of the film; forming a second metal layer pattern including the signal lines; forming a conductive layer pattern including the pixel electrodes; forming a first contact hole that electrically connects an end of the second connection wiring, to the signal line, in each of the display pixel dots; and forming a second contact hole that electrically connects an end of the first connection wiring, to the pixel electrode, in each of the display pixel dots; wherein at least in the peripheral non-viewing area extending in a direction along the signal line, the second contact hole and/or the pixel electrode is omitted; and the first connection wiring extends in a direction away from the scanning line at a position distanced from the switching element, and has a pad having a width larger than other part of the first connection wiring at its distal end.

Embodiment

An array substrate of an embodiment will be described in conjunction with FIGS. 1 to 4. An array substrate for forming a display panel of an LDC device is explained in detail at below whereas substantially the same goes for an array substrate for forming a display panel of an organic EL display device as explained later. An array substrate exemplified here adopts a TFT formed of a low-temperature polysilicon film as a switching element. Specifically, an array substrate exemplified here is for an FPD device that has 7 inches of a diagonal dimension of an image display area and makes WVGA display (800×480).

Disclosures in respect of the embodiments are only for sake of examples, and modifications easily conceivable by a skilled person in the art without departing from the gist of the invention are included in the scope of the invention as a matter of course. For sake of clarity, drawings may be schematically illustrated in terms of width, thickness and shape of the elements and/or parts differently from the reality. Illustrations in the drawings are mere examples, and are not intended to limit the scope of the invention.

Figure 2:
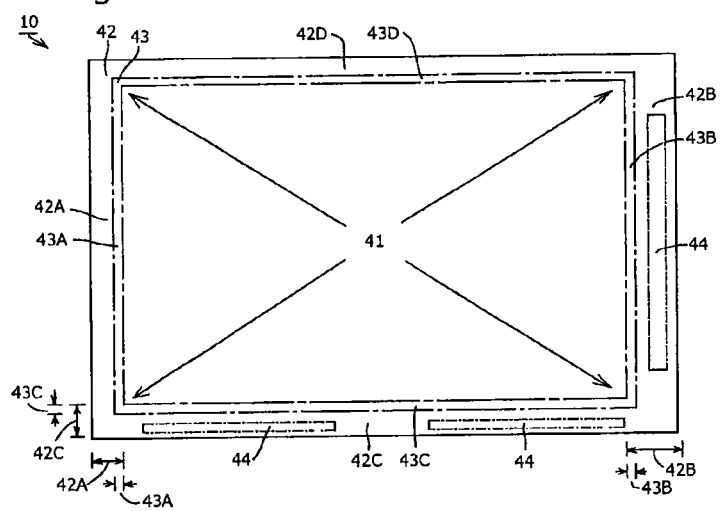
FIG. 2 is a schematic plan view showing an entire area and its divided areas of the array substrate shown in FIG. 1.

As shown in FIGS. 1 and 2, almost entire area of an array substrate 10 is a rectangular view area 41, which corresponds to the image display area of the FPD device, whereas a peripheral non-viewing area 42 encircles the view area 41, as a rectangular frame-shaped peripheral area. Within the peripheral non-viewing area 42, there is arranged a dummy pixel area 43, which is relatively narrow and adjacent to a fringe of the view area 41. The dummy pixel area 43 comprises Y-side dummy pixel areas 43A and 43B that are arranged in two Y-side peripheral edge areas 42A and 42B, which extend respectively along right-hand-side and left-hand-side short sides of the rectangular of the array substrate 10, that is, sides in a signal line direction (Y-direction). The dummy pixel area 43 also comprises X-side dummy pixel areas 43C and 43D that are arranged in two X-side peripheral edge areas 42C and 92D, which extend respectively along top and bottom long sides of the rectangular of the array substrate 10, that is, sides in a scanning line direction (X direction). Driver circuits 44 are arranged at outside of the dummy pixel area 43, at least along one long side and one short side of the rectangular of the array substrate 10. In one detailed example, as illustrated in FIG. 2, the driver circuits 44 are arranged at outside of the X-side dummy pixel area 43C, which extends along one long side of the rectangular and at outside of the Y-side dummy pixel area 93A, which extends along one short side of the rectangular.

Throughout the view area 41 and the dummy pixel area 43, there are: an array of scanning lines 21 and an array of signal lines 31 that intersect the scanning lines 21; a switching element 15, which are arranged for each intersection of the scanning and signal lines. In the view area 41, a pixel electrode is also arranged for each intersection of the scanning and signal lines. Thus, arrayed in a matrix pattern are: display pixel dots 27, each of which has the switching element 15 and the pixel electrode; and dummy pixel dots 26, each of which has the switching element 15. All the display pixel dots 27 have same dimensions in the signal line direction and the scanning line direction (dimensions in the X direction and the Y direction), and have substantially same construction.

In a preferred embodiment, a width of the dummy pixel dots 26 in the Y-side dummy pixel areas 43A and 43B (a dimension in the X direction) is in a range from 50 to 90%, specifically, from 60 to 80% of a width of the display pixel dots 27 (a dimension in the X direction). In the preferred embodiment, a length of the dummy pixel dots 26 in the X-side dummy pixel areas (a dimension in the Y direction) is in a range from 20 to 80%, specifically, from 30 to 60% of a length of the display pixel dots 27 (a dimension in the Y direction).

In one specific example, 800×3 pieces of the signal lines 31 and 480 pieces of the scanning lines 21 are arrayed in the view area 41; seven pieces of the signal lines 31 are arrayed in each of the Y-side dummy pixel areas 43A and 43B on right-hand and left-hand sides; and seven pieces of the scanning lines 21 are arrayed in each of the X-side dummy pixel areas 93C and 43D on top and bottom sides. Therefore, seven rows of the dummy pixel dots 26 are arrayed in each of the Y-side dummy pixel areas 43A and 43B; and 7 rows of the dummy pixel dots 26 are arrayed in each of the X-side dummy pixel areas 43C and 43D. In one specific example, each of the display pixel dots 27 has a width (a dimension in the X direction) of 75 μm and a length (a dimensions in the Y direction) of 225 μm; each of the dummy pixel dots 26 in the Y-side dummy pixel areas 43A and 43B has a dimension of 60 μm in the X direction; and each of the dummy pixel dots 26 in the X-side dummy pixel areas 43C and 43D has a dimension of 80 μm in the Y direction.

Figure 3:
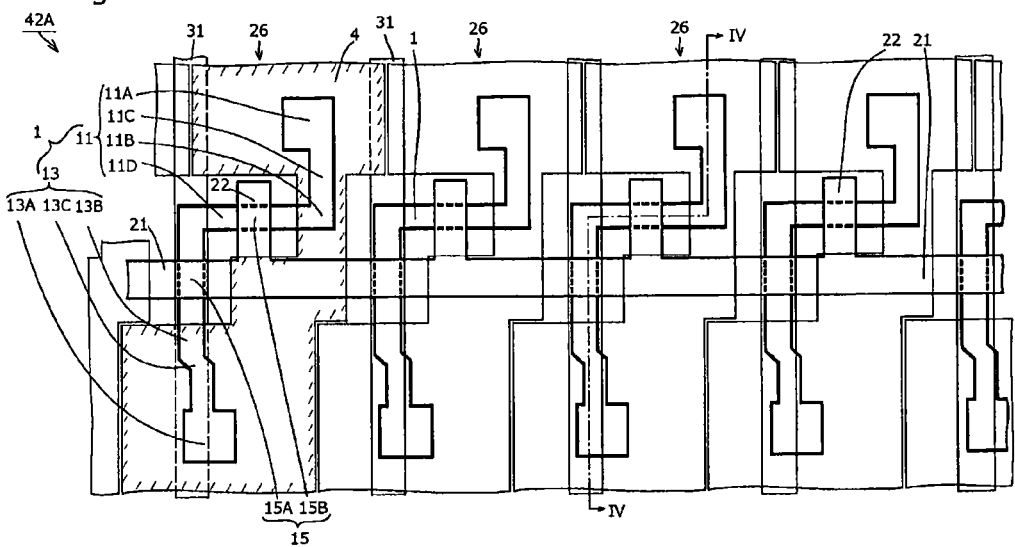
FIG. 3 is a partly enlarged view of FIG. 1.
Figure 4:
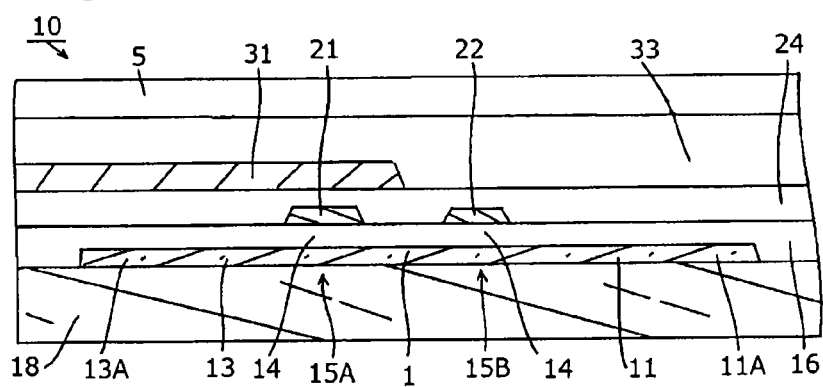
FIG. 4 is a cross-sectional view showing a laminate construction by a section along VI-VI line in FIG. 3.

As shown in FIGS. 1, 3 and 4, a dual purpose pattern 1 for forming a semiconductor film and a wiring is arranged in each of the display pixel dots 27 and in each of the dummy pixel dots 26. Each of the dual purpose patterns 1 is shaped as a single continuous pattern in the illustrated example, and is specifically shaped as a single-stroke drawn line or a single trajectory such as a substantially Z shape, in which three straight-line parts are combined at a right angle as in the dummy pixel dots 26, or a substantially L shape as in the display pixel dots 27. The dual purpose patterns 1 are formed of a low-temperature polysilicon film in the specific example as explained later; and adequate doping is applied to a semiconductor film portion and wiring parts. In the illustrated example, first and second TFTs 15A and 15B are formed on each of the dual purpose patterns 1 at positions intersecting the scanning line 21 and its branch 22; and thus, each of the switching elements 15 is formed of a pair of the TFTs 15A and 15B arranged in series as just mentioned.

In the illustrated example, the dual purpose pattern 1 comprises first and second connection wirings 11 and 13. As starting from the switching element 15 on a side of the first TFT 15A, a gate electrode of which is the scanning line 21, the second connection wiring 13 runs along the signal line 31 as overlapped with or arranged in proximity to the signal line 31. The first connection wiring 12 or 11 runs from the switching element 15 on a side of the second TFT 15B. The branch 22 runs straight in the signal line direction in the specific example. Therefore, the dual purpose pattern 1 changes the direction at the switching element 15 between the signal line direction and the scanning line direction. Hence, the dual purpose pattern 1 has a straight-line part 11D or 12D that runs along the scanning line 21 as partly overlapped with or in proximity to the switching element 15 and has a straight-line part 13B that runs along the signal line 31. In the illustrated specific example, widths or line thickness of the straight-line parts 11D, 12D and 13B are narrower than a width or line thickness of the scanning lines 21, and is in a range from 25 to 70% of the width of the scanning lines 21, specifically in a range from 30 to 60%.

The second connection wiring 13 comprises: the straight-line part 13B extending along the signal line 31; and a pad 13A at a distal end of the wiring pattern 13. In the illustrated specific example, the pad 13A has a substantially square shape, and a dimension of one side of the square shape is substantially same as the width of the signal line 31. In other words, the dimension of one side of the square shape of the pad 13A is within a range from 80 to 130% of the width of the signal line 31.

In each of the display pixel dots 27, the second connection wiring 13 is electrically connected to the signal line 31 via a first contact hole 25 arranged in the pad 13A at the distal end of the wiring pattern 13. Moreover, the first connection wiring 12 extends in parallel to and along the scanning line 21 without being bent at a distal side as from the second TFT 15B on the branch 22. In other words, the entire part of the first connection wiring 12 is formed of a straight-line part extending along the scanning line 21. In particular, in the illustrated specific example, the pad is not provided at the distal end of the first connection wiring 12, and thus, the wiring pattern 12 is straight and is constant in width as a whole. The first connection wiring 12 is electrically connected to a pixel electrode formed of a transparent conductive material such as ITO through: an island metallic pattern 32; a second contact hole 35; and a third contact hole 28 formed simultaneously with the signal line 31.

When the pixel electrode 4 is formed of a metal such as aluminum, the first connection wiring 12 may be connected to the pixel electrode through a single contact hole and not through the island metallic pattern 32.

In each of the dummy pixel dots 26, the dual purpose pattern 1 in a form of the single trajectory is not connected with any of the pixel electrodes as they are not existed in the dummy pixel dots 26. Moreover, any among the pixel electrode, the contact hole and the island metallic pattern is not arranged in the dummy pixel dots 26. The first connection wiring 11 extends from the switching element 15 in parallel to the scanning line 21, then is bent at a right angle, and extends in a direction away from the scanning lines 21, that is, straight in the direction of the signal line 31. The first connection wiring 11 has at its distal end, a pad 11A having a larger width. Specifically, a part having the pad 11A in the first connection wiring 11 is constructed such that a line segment 11C extending in the signal line direction or upward in the drawing, and then is expanded in the scanning line direction to a side of the switching element 15. In other words, the pad 11A flushes with the straight line segment 11C at a side facing the view area 41. The dimension of the pad 11A is substantially same as the dimension of the pad 13A of the second connection wiring 13. In other words, the dimension of the pad 11A is in a range from 80 to 130% of the width of the signal line 31.

When high voltage generated by static electricity is applied to the scanning lines 21, an electric charge would be released or diffused through the pads and the line segments. Due to presence of the pad 11A and the line segment 11C, the width of the dummy pixel dots 26 is able to be set smaller than the width of the display pixel dots 27.

In the specific example, the first connection wiring 11 extends along the scanning lines 21 by a length of 0.6 to 1.5 times, specifically 0.7 to 1.3 times of the width of the branch 22 (a dimension in the scanning line direction), then forms a bent portion 11B, and extends in a direction away from the scanning lines 21, specifically in the direction along the signal line 31. Typically, the width of the branch 22 (the scanning line direction) would be substantially same as the width of the scanning line 21. Meanwhile, a dimension extending further from the bent portion 11B with the same width would be in a range from 1 to 3 times, specifically, from 1.3 to 2 times of the dimension between the branch 22 and the bent portion 11B. In the specific example, the pad 11A has a rectangular shape, specifically, a square shape, and the dimensions in the scanning line direction and the signal line direction are in a range from 1.5 to 4 times, specifically, 1.8 to 3 times of the width of the dual purpose pattern 1 at a part other than the pad.

In the illustrated preferred embodiment, in each of the dummy pixel dots 26, the signal line 31 is not electrically connected to the second connection wiring 13. In other words, the dual purpose pattern 1 is a float pattern. Nevertheless, the pad 13A of the second connection wiring 13 are exactly in a same manner as pad 11A of the first connection wiring, and the dimensions are almost same between the pad 13A and the pad 11A, respectively of the first and second wiring patterns 11 and 13. Meanwhile, in the dummy pixel dots 26, the straight-line part 13B of the second connection wiring 13 has an oblique shift portion 13C that runs obliquely from the signal line direction toward the interior of the pixel dot, so as to shift position in the scanning line direction, of the line segment extending along the signal line 31. In other words, the straight-line part is deformed into a shape having a stepped portion. In other words, the second connection wiring 13 in the dummy pixel dots 26 runs as starting from the switching element 15 along the signal line 31 connected thereto, then runs slightly obliquely, runs again in the direction along the signal line 31 away from the scanning lines 21 and has the pad 13A at distal end of the wiring pattern 13. Such pad 13A in the dummy pixel dot 26 is arranged in same manner and same dimensions with the corresponding pad 13A in the display pixel dots 27.

In the illustrated example, the left and right Y-side dummy pixel areas 43A and 43B are arranged with metallic island patterns 23, which are formed simultaneously as the scanning lines 21 and are arrayed in a manner of dot lines or broken lines in parallel to the scanning lines 21. The metallic island patterns 23 at an each portion between adjacent ones of the scanning lines 21 comprises: first solid patterns 23A arrayed in a row in a manner of a broken line in the scanning line direction, at a center portion between the adjacent scanning lines 21; and smaller second solid patterns 23B arrayed in two broken lines, between which the row of the first solid patterns 23A is interposed.

Each of the second solid patterns 23B has a square shape having substantially same dimensions as the pads 11A and 13A of the first connection wiring 11 and the second connecting wiring 13 in the illustrated specific example. Here, distances from one of the second solid patterns 23B to adjacent one of the second solid patterns 23B, to adjacent one of the first solid patterns 23A and to adjacent one of the pads 11A are substantially same as or slightly smaller than the dimension of each of the second solid patterns 23B. Meanwhile, in the illustrated example, the first solid patterns 23A is larger in dimension in the scanning line direction than the width of the dummy pixel dots 26, and has a dimension falling within a range from 4 to 8 times of that in the second solid patterns 23B. The dimension in the signal line direction is within a range from 1.5 to 5 times of that in the second solid patterns 23B. In the illustrated example, the second solid patterns 23B are a rectangular solid pattern, and the long side is oriented in the scanning line direction.

In the example illustrated in the lamination-wise cross-sectional view of FIG. 4, a large-thickness resin film (flattening film) 33 having a thickness in a range from 0.6 to 1.5 μm is arranged to cover a metallic wiring pattern that comprises the signal line 31. In the view area 41, pixel electrodes are arranged on the large-thickness resin film 33, and are covered by an alignment film 5 or an adequate protecting film. By the large-thickness resin film 33, a light-shielding film (black matrix) or a color filter layer may be formed. The light shielding film and the color filter layer may be arranged on a counter substrate, which is eventually combined with the array substrate 10 so that a sealing material and a liquid crystal layer are interposed between the array and counter substrates.

If the array substrate is for the display panel of the organic EL display apparatus, the pixel electrodes are covered with an organic EL film and are normally formed of a metal.

At below, processes of manufacturing an LCD device according to the embodiment will be described with reference to a specific example. First of all, a method of manufacturing the array substrate will be described in detail.

(1) First Patterning

A two-layer film formed of an oxide silicon film and a nitride silicon film is deposited on a glass substrate 18 (FIG. 4) by a plasma CVD technique. Alternatively, film formation is performed by using TEOS (TetraEtyl Ortho Silicate: $Si(C_2H_5)_4$). In this way, an undercoat layer is formed for curbing diffusion of impurities. Subsequently, a non-crystal silicon film is deposited to thickness of 50 nm by the plasma CVD technique. Then, the non-crystal silicon film is dehydrated by placing and annealing the glass substrate 18 as a whole in a furnace and then irradiating the entire surface of the non-crystal silicon film with an excimer laser to achieve fusion and crystallization.

A polysilicon film obtained in this manner is patterned, so as to form the dual purpose patterns 1 for semiconductor film/wiring, each of which comprises the first and second TFTs 15A and 15B in the display or dummy pixel dot, as well as the semiconductor film patterns of TFTs in the driver circuits 44 and patterns for numbering 17. The numbering 17 indicates an address of scanning line or signal line so as to be readable from a back side, and is arranged in the Y-side dummy pixel areas 43A and 43B or in the X-side dummy pixel areas 43C and 43D.

(2) Second Patterning

A gate insulating film 16 is formed to have a thickness of 100 nm as a single layer oxide silicon film, by the plasma CVD technique. Subsequently, a molybdenum-tungsten alloy film (MoW film) having a thickness of 300 nm for example is deposited by a sputtering technique, and then is subjected to a patterning to form 480 pieces of the scanning lines 21 and the branches 22 as well as the metallic patterns 23 in a dotted-line arrangement.

(3) Third Patterning

Using the scanning lines 21 and the branches 22 as masks and an amorphous-phase-separation ion injection apparatus, impurities are $n^+$ doped in an area 4 including a predetermined part of the dual purpose patterns 1. Accordingly, the dual purpose pattern 1 forms a channel area at positions where the pattern 1 overlaps the signal line 31 and the branch 22 as the gate electrode. Specifically, coplanar TFTs may be formed according to a method disclosed in JP-A-2001-339070, for example.

Subsequently, an inter-layer insulating film 24 formed of an oxide silicon film is deposited to have a thickness of 600 nm, by the Plasma CVD technique; and then, the first contact holes 25 and the third contact holes 28 are formed by patterning, for electrically connecting the signal lines 31 and the island metallic patterns 32 to the dual purpose patterns 1.

(4) Fourth Patterning

For example, a three-layer metallic film (Mo/Al/Mo) is formed by a sputtering technique so that an aluminum metallic layer is interposed between upper and lower molybdenum (Mo) layers. For example, a Mo layer having a thickness of 25 nm, an aluminum (Al) layer having a thickness of 250 nm, and an Mo layer having a thickness of 50 nm are deposited in this order. By patterning this three-layer metallic film, 1024×3 pieces of signal lines 31 and the island metallic patterns 32 are formed.

(5) Fifth Patterning

After photosensitive curable resin liquid formed of acryl-based resin or the like has been applied uniformly to have a thickness of 1 μm, a series of processes such as exposure with a mask pattern, developing, and so forth is performed to form the large-thickness resin film 33 that is transparent; and the second contact holes 35 are formed for electrically connecting the pixel electrodes to the island metallic patterns 32 respectively. When to form the light-shielding film and/or the color filter layer are by the large-thickness resin film 33, performed is a series of processes including application of colorant by an ink jet technique and fixation. An inorganic inter-layer insulating film formed of a nitride silicon film or the like may be formed if needed, before forming the large-thickness resin film 33.

(6) Sixth Patterning

An ITO layer is deposited to have a thickness of 150 nm for example as a transparent conductive layer, and then, pixel electrodes are formed by patterning. In this manner, the array substrate 10 is completed.

(7) Formation of Pixel-Electrode Covering Film 5

If the array substrate 10 is for a general LCD device, a resin film formed of polyimide is formed on a surface of the array substrate 10, and then rubbing process is performed thereon, so as to render the pixel-electrode covering film 5 to an alignment film. If the array substrate 10 is for the organic EL display device, pixel-electrode covering film 5 is formed as the organic EL film.

Subsequently, when to manufacture the display panel of the LCD device, the sealing material is applied so as to surround the view area 41, a liquid crystal material is drop-wise applied thereon; the array and counter substrates are assembled with each other and subjected to pressing; and then, the seal material is cured. When to manufacture the organic EL display device, according to an example adopting a dam-fill technique, a sealing film is formed to cover the organic EL film; a dam material is drawing-wise applied, which corresponds to the sealing material of the LCD display panel; a filling material is drop-wise applied; the array and counter substrates are assembled with each other and subjected to pressing; and curing is made.

All embodiments which may be implemented by those skilled in the art by modifying the design as needed on the basis of the embodiment are also included in the range of the invention as long as the gist of the invention is included.

In the category of the thought of the invention, those skilled in the art may imagine various modifications or corrections, and examples of these modifications and corrections are considered to be included within the scope of the invention. For example, those added, deleted, or modified in design of the components by those skilled in the art as needed, or those in which processes are added or deleted, or the conditions are changed may be included within the range of the invention as long as the gist of the invention is included.

Those apparent from the description of the specification or imagined easily by those skilled in the art about other advantageous effects generated by the configuration described in the embodiment are considered by being generated by the invention as a matter of course.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An array substrate comprising:
an array of scanning lines and an array of signal lines that intersect the scanning lines;
a switching element and a pixel electrode, which are arranged for each intersection of the scanning and signal lines;
a view area, in which display pixel dots are arrayed and which corresponds to an image display area of a flat-panel display (FPD) device; and
a dummy pixel area, in which dummy pixel dots are arrayed and which is in a peripheral non-viewing area that surrounds the view area; wherein,
in each of the display pixel dots and in each of the dummy pixel dots, a first connection wiring and a second connection wiring are arranged to extend respectively from one terminal and another terminal of the switching element;
in each of the display pixel dots in the display area, the first connection wiring is connected to the pixel electrode via a contact hole while the second connection wiring is connected to the signal line via a contact hole;
in each of the dummy pixel dots, the first connection wiring is not electrically connected to any of the pixel electrodes;
in the peripheral non-viewing area extending in a direction along the signal line, the first connection wiring extends in a direction away from the scanning line at a position distanced from the switching element, and has a pad having a width larger than other part of the first connection wiring at its distal end;
wherein, in each of the display and dummy pixel dots, a continuous pattern, which is formed of a polysilicon film or other film capable to form wirings and a semiconductor film, is arranged and comprises the first and second connecting wiring patterns and the semiconductor film of the switching element; and
wherein the second connection wiring in each of the dummy pixel dots is not electrically connected with the signal line, and has an oblique shift portion that runs obliquely from the signal line direction toward the interior of the pixel dot, so as to shift position in the scanning line direction, of a line segment of the second connection wiring, which substantially runs along the signal line.

* * * * *